United States Patent
Yun et al.

(10) Patent No.: US 10,499,548 B2
(45) Date of Patent: Dec. 3, 2019

(54) DISPLAY DEVICE

(71) Applicant: LG ELECTRONICS INC., Seoul (KR)

(72) Inventors: Seunghyun Yun, Pyeongtaek-si (KR); Jaewook Kwon, Pyeongtaek-si (KR); Yongseong Kim, Pyeongtaek-si (KR); Woohyuk Choi, Pyeongtaek-si (KR); Inkeun Ryu, Pyeongtaek-si (KR)

(73) Assignee: LG ELECTRONICS INC., Seoul (KR)

( * ) Notice: Subject to any disclaimer, the term of this patent is extended or adjusted under 35 U.S.C. 154(b) by 60 days.

(21) Appl. No.: 15/457,363

(22) Filed: Mar. 13, 2017

(65) Prior Publication Data

US 2017/0188489 A1    Jun. 29, 2017

Related U.S. Application Data

(63) Continuation of application No. 14/062,021, filed on Oct. 24, 2013, now Pat. No. 9,635,787.

(30) Foreign Application Priority Data

Jul. 9, 2013 (KR) ........................ 10-2013-0080262

(51) Int. Cl.
*H05K 7/20* (2006.01)
*G06F 1/16* (2006.01)
(Continued)

(52) U.S. Cl.
CPC ....... *H05K 7/20963* (2013.01); *G06F 1/1601* (2013.01); *G06F 1/1637* (2013.01);
(Continued)

(58) Field of Classification Search
CPC .... H05K 7/20963; H05K 5/0017; H05K 5/03; H05K 5/0008; G06F 1/1601;
(Continued)

(56) References Cited

U.S. PATENT DOCUMENTS 8,467,187 B2 * 6/2013 Itazawa ............. H05K 7/20963
165/80.3
2002/0153836 A1   10/2002 Oishi et al.
(Continued)

FOREIGN PATENT DOCUMENTS

CN   1607866    4/2005
CN   101261790  9/2008
(Continued)

OTHER PUBLICATIONS

Chinese Office Action dated Jul. 4, 2017 issued in Application No. 201380078106.7 (English translation attached).
(Continued)

*Primary Examiner* — Charles S Chang
(74) *Attorney, Agent, or Firm* — KED & Associates, LLP

(57) ABSTRACT

Disclosed is a display device that includes a display panel and a multi-layered panel provided adjacent the display panel. The multi-layered panel may include a front plate located toward the display panel, a rear plate provided parallel to the front plate, and a honeycomb mesh interposed between the front plate and the rear plate. The honeycomb mesh may have a plurality of hexagonal cells. A metal plate may be coupled to a rear surface of the multi-layered panel and a drive board may be seated on the metal plate. At least one of the front plate or the rear plate may include at least one opening that extends parallel to a shorter side of the display device.

16 Claims, 6 Drawing Sheets

(51) Int. Cl.
*G09F 9/30* (2006.01)
*H05K 5/00* (2006.01)
*H05K 5/03* (2006.01)
*G02F 1/1333* (2006.01)

(52) U.S. Cl.
CPC ............. *G09F 9/30* (2013.01); *H05K 5/0008* (2013.01); *H05K 5/0017* (2013.01); *H05K 5/03* (2013.01); *G02F 2001/133314* (2013.01); *G06F 2200/1612* (2013.01)

(58) Field of Classification Search
CPC .. G06F 1/1637; G06F 2200/1612; G09F 9/30; G02F 2001/133314
USPC .................................................... 349/58–60
See application file for complete search history.

(56) References Cited

U.S. PATENT DOCUMENTS

| | | | | |
|---|---|---|---|---|
| 2007/0024167 | A1* | 2/2007 | Kim | ................... H05K 7/20963 313/46 |
| 2009/0009047 | A1* | 1/2009 | Yanagawa | .......... H05K 7/20009 313/46 |
| 2010/0097524 | A1* | 4/2010 | Kuromizu | ............ G02B 5/0247 348/553 |
| 2013/0170116 | A1 | 7/2013 | In et al. | |
| 2013/0170156 | A1* | 7/2013 | Jung | .................... H05K 5/0017 361/749 |
| 2013/0329162 | A1* | 12/2013 | Fujii | ........................ H05K 7/14 349/58 |

FOREIGN PATENT DOCUMENTS

| | | |
|---|---|---|
| CN | 101652682 | 2/2010 |
| CN | 201667186 | 12/2010 |
| CN | 202549200 | 11/2012 |
| CN | 103187008 | 7/2013 |
| CN | 103187009 | 7/2013 |
| JP | 2004-0287413 | 10/2004 |
| KR | 10-2008-0054681 | 12/2009 |

OTHER PUBLICATIONS

International Search Report dated Mar. 14, 2014 issued in Application No. PCT/KR2013/009200.
U.S. Office Action dated Dec. 1, 2015 issued in co-pending U.S. Appl. No. 14/062,021.
U.S. Office Action dated Jun. 15, 2016 issued in co-pending U.S. Appl. No. 14/062,021.
U.S. Notice of Allowance dated Dec. 21, 2016 issued in co-pending U.S. Appl. No. 14/062,021.

* cited by examiner

DISPLAY DEVICE

CROSS-REFERENCE TO RELATED APPLICATION(S)

This application is a Continuation Application of prior U.S. patent application Ser. No. 14/062,021 filed Oct. 24, 2013, which claims priority under 35 U.S.C. § 119 to Korean Application No. 10-2013-0080262 filed in Korea on Jul. 9, 2013, whose entire disclosure is hereby incorporated by reference.

BACKGROUND

1. Field

The present disclosure relates to a display device that includes a multi-layered panel having a honeycomb pattern mesh.

2. Background

A conventional display device using a liquid crystal display panel or a plasma display panel includes a glass panel providing a basic screen, an intermediate frame, and a rear cover. Among these components, the intermediate frame serves to support a variety of display device drive circuits arranged thereon, and to connect the glass panel and the rear cover to each other. On the other hand, the rear cover serves to increase rigidity of the entire display device, to efficiently radiate heat generated from the circuits, and to define an external appearance of the display device.

In recent years, in a bid to reduce the thickness of the display device, drastic attempts to improve and simplify a conventional configuration of the display device have been implemented. In particular, as the thickness of the display device is reduced, enhancement in mechanical rigidity of the rear cover, development of heat radiation materials, and configuration improvement have been continuously studied.

Although a representative material for a typical rear cover of conventional display devices is a metal material, such as aluminum, this material may limit mechanical properties of the rear cover as the thickness of the rear cover is extremely reduced.

In particular, as a level of contribution of the rear cover to the rigidity of the entire display device increases, it is necessary that the rear cover is formed of a material having requisite mechanical properties. The conventional aluminum rear cover has difficulty in achieving required mechanical properties. Moreover, this problem may worsen as the size of the rear cover increases. For this reason, there is demand for developments of novel materials for the rear cover except for aluminum as well as novel configurations thereof.

BRIEF DESCRIPTION OF THE DRAWINGS

The embodiments will be described in detail with reference to the following drawings in which like reference numerals refer to like elements wherein.

DETAILED DESCRIPTION

Hereinafter, a display device 100 having a multi-layer panel 130 according to the present disclosure will be described in detail with reference to the accompanying drawings. With respect to constituent elements used in the following description, suffixes "module" and "unit" are given or mingled with each other only in consideration of ease in the preparation of the specification, and do not have or serve as different meanings.

Figure 1:
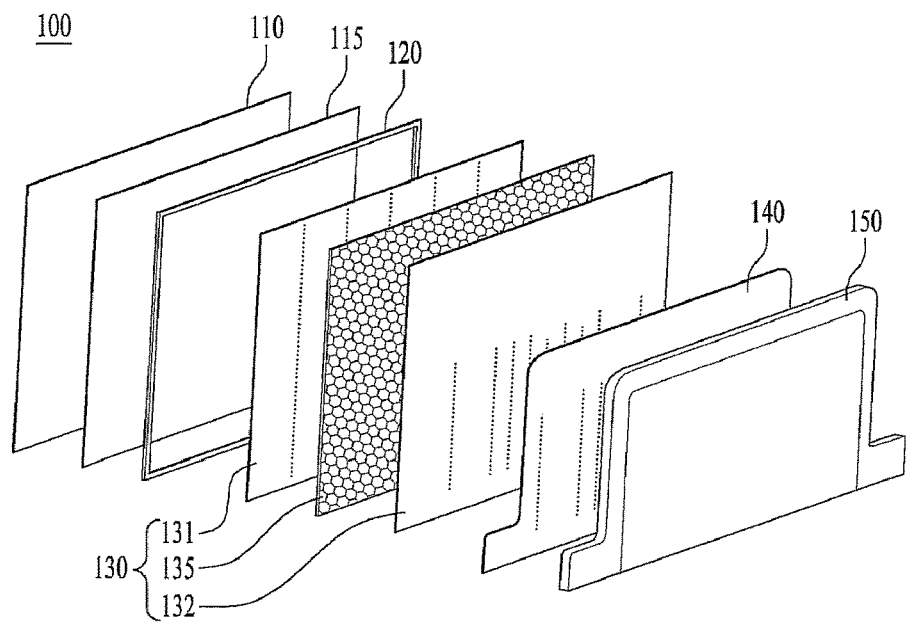
FIG. 1 is an exploded perspective view showing a display device according to one embodiment of the present disclosure.

FIG. 1 is an exploded perspective view showing the display device 100 according to one embodiment of the present disclosure. The display device 100 of the present disclosure includes a display panel 110, a middle frame 120, a multi-layer panel 130, a metal plate 140, and a rear cover 150.

The display panel 110 may serve to output an image on a screen. More specifically, the display panel 110 divides an image into a plurality of pixels to digitalize information, such as color, brightness, chroma, etc., on a per pixel basis into electric signals, thereby controlling emission of light from the pixels to output an image having desired color, brightness and chroma based on the electric signals.

Flat panel display devices having the above-described image output function may be utilized in various ways in liquid crystal display, thin film transistor liquid crystal display, organic light emitting diode (OLED) display fields. In particular, as the OLED display device 100 has recently been used, a configuration is simplified and omission of a support structure is necessary to achieve a reduced thickness and greater heat radiation.

The middle frame 120 may serve to provide a finished look around the periphery of the display device 100 and to align the display panel 110 and the multi-layer panel 130 with each other. Although a top case configured to cover a front surface and a rear case configured to cover a rear surface may be provided individually, in order to reduce the thickness of the display device 100, and to provide a simplified configuration as well as a reduction in the size of a bezel, the middle frame 120 may be used instead of the top case that covers the front surface.

The multi-layer panel 130 may be attached to a rear surface of the display panel 110 to support the display panel 110. Reduction in the thickness of the display device 100 causes reduction in the thickness of a rear panel that supports the rear surface of the display panel 110. An excessively reduced thickness of the rear panel may reduce rigidity and increase possibility of deformation, whereas an excessively increased thickness of the rear panel may increase the weight and manufacturing costs.

To solve the above-described problem, the multi-layer panel 130 may be used as the rear panel. The multi-layer panel 130 may provide sufficient rigidity while minimizing increase in weight. As exemplarily shown in FIG. 1, the multi-layer panel 130 may have a triple layered configuration consisting of a pair of thin plates 131 and 132 and a honeycomb mesh 135 interposed between the thin plates 131 and 132.

The honeycomb mesh 135 is configured such that a plurality of unit cells in the form of empty hexagonal shapes may be arranged in a plurality of columns to produce a honeycomb structure or pattern. Sidewalls of the unit cells and the thin plates 131 and 132 are oriented to face in different directions. For example, the sidewalls of the unit cells may be perpendicular to the thin plates 131 and 132. As such, the unit cells may serve to provide added rigidity and prevent bending of the display device 110. As compared to a conventional monolayer rear panel, the multi-layer panel 130 may have a smaller weight and achieve greater rigidity despite use of a reduced amount of material. Due to the honeycomb pattern mesh and thin metal plate layers, the multi-layered plate 130 may also be referred to herein as a sandwich honeycomb panel.

The multi-layer panel 130 and the display panel 110 may be attached to each other with an adhesive layer 115 interposed therebetween. The adhesive layer 115 may be formed by applying an adhesive, or may be formed of a double-sided adhesive tape. The adhesive layer 115 may be laminated on the entire rear surface of the display panel 110, or the adhesive layer 115 may be laminated only on a part of the rear surface.

The metal plate 140 may be attached to a rear surface of the multi-layer panel 130, and drive boards 147, 148 and 149 (see FIG. 11) may be seated on the metal plate 140. The metal plate 140 may be configured to cover the entire rear surface or a partial region of the multi-layer panel 130. The metal plate 140 may have a size required to support the drive boards 147, 148 and 149 arranged thereon, and thus may cover only a part of the rear surface of the multi-layer panel 130.

The metal plate 140 may be formed of a metal material, such as aluminum, to achieve rigidity of the display device 100 and to radiate heat generated from the drive boards 147, 148 and 149. To reduce bending deformation, reinforcement ribs may be formed at a center region of the metal plate 140.

The drive boards 147, 148 and 149 seated on the metal plate 140 may include three types. The power supply board 147 may be a hardware that converts Alternating Current (AC) received from an external source into Direct Current (DC) that will be stably used by the display device 100, so as to supply power suitable for each system. If the power supply board 147 fails to stably supply power to the system, the system may be down or may malfunction. The power supply board 147 may be divided into an electromagnetic interference filter part, an AC-DC rectifier part, a DC-AC switching converter part, and an output part, and may emit a great quantity of heat during driving.

The main board 148 may serve to control the display panel 110 to generate a screen image and to control general functions of respective components. As functions of the display device 100 have recently been diversified, the number of elements mounted on the main board 148 has increased, and functions of the respective elements become important.

The timing controller 149 may be provided to a large screen of 10 inches or more, and may include semiconductors that adjust the quantity of data to be transmitted to the drive unit of the display panel 110 and improve resolution of an image. The timing controller 149 receives image information and transmits the same to the drive unit of the display panel 110 such that the entire display panel 110 outputs an image with no time difference.

Although conventional display devices having a small display panel do not need the timing controller 149, increase in the size of a screen causes time difference when a color image is formed throughout the screen and this appears as an afterimage on the screen. To prevent this, the timing controller 149 adjusts transmission time of signals.

In particular, the power supply board 147 and the main board 148 generate a great quantity of heat, and thus a region affected by both the power supply board 147 and the main board 148 has a relatively high temperature. That is, a place where the power supply board 147 and the main board 148 are located generates a great quantity of heat, and radiation of heat is important to the corresponding regions.

If heat generated from the drive boards 147, 148 and 149 or heat generated from the display panel 110 are not radiated and the temperature of the display device 100 increases, the aforementioned respective members undergo thermal expansion. Although there may be no problems if the respective members expand and contract at the same rate, the respective members exhibit expansion and contraction at different rates of thermal expansion.

The metal plate 140 or the multi-layer panel 130, which are formed of a metal material, have a high rate of thermal expansion, whereas the display panel 110 has a low rate of thermal expansion. Such difference between the rates of thermal expansion of the respective members causes the member having a lower rate of thermal expansion to be concavely bent as temperature increases.

Since the multi-layer panel 130 has a higher rate of thermal expansion than that of the display panel 110, if heat is generated during driving of the display device 100, both ends of the display panel 110 are bent forward, causing a front surface of the display panel 110 to be concavely deformed. In current situation in which sizes of flat display devices 100 is increasing, such bending deformation may be easily noticeable. Therefore, it is necessary to prevent this bending deformation.

Accordingly, the present disclosure has a feature in that, to compensate for thermal deformation due to difference between rates of thermal expansion of the respective members during thermal expansion, a rigid bar may be provided to compensate for structural deformation of the multi-layer panel 130 and the metal plate 140. Hereinafter, structural features of the respective members will be described.

Figure 2:
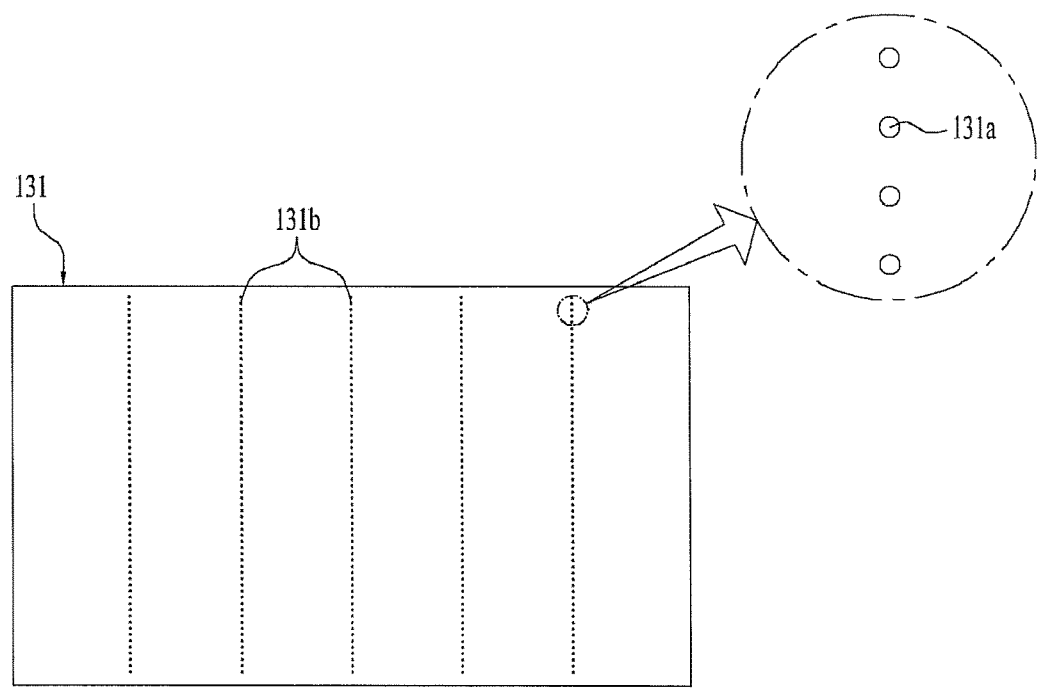
FIG. 2 is a rear view showing a thin front plate of the display device.

FIG. 2 is a rear view showing the thin front plate 131 of the display device 100 according to one embodiment of the present disclosure. The thin front plate 131 has an opening perforated in a direction parallel to a short side of the display device 100 (e.g., vertical direction). Since effects of thermal expansion appears more in a longer side direction, bending deformation occurs in the longer side direction to a greater degree. Accordingly, to compensate for deformation in the longer side direction, the opening is formed in a direction perpendicular to a longer side.

In general, since the display device 100 has a short vertical length and a long horizontal length, in the following description, the horizontal direction refers to a direction parallel to a long side and the vertical direction refers to a direction parallel to a short side. It should be appreciated, however, that the present disclosure is applicable for display panels having various shapes, including those which are longer height than width.

Figure 3:
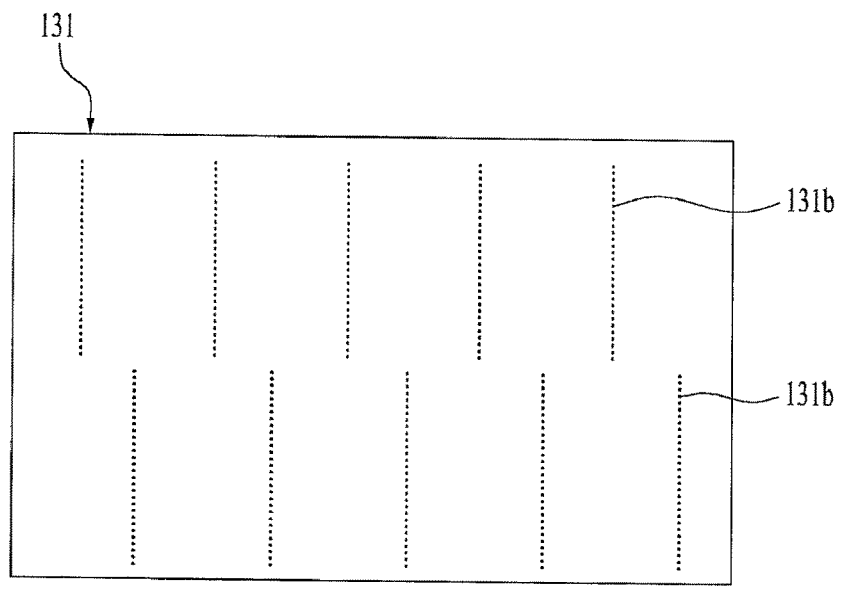
FIGS. 3 and 4 are rear views of a thin rear plate of the display device.
Figure 4:
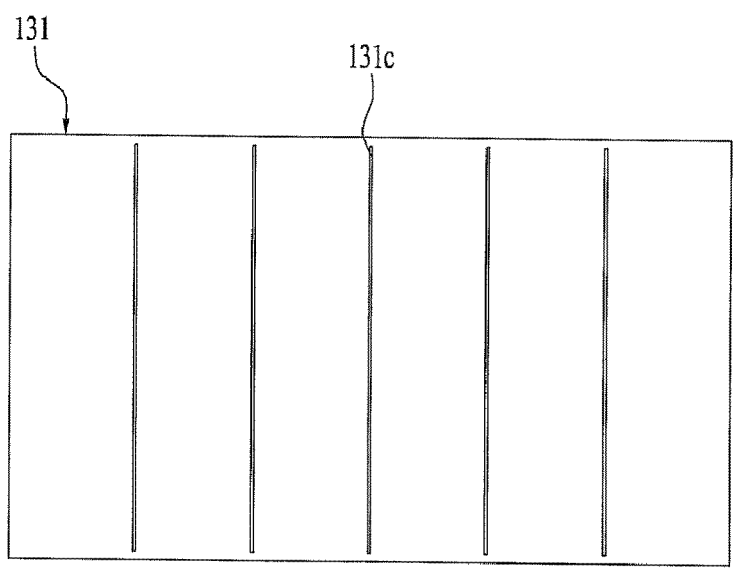

The opening, as exemplarily shown in FIG. 2, may include a plurality of holes 131a aligned in a vertical direction to define a plurality of vertical lines 131b horizontally spaced apart from one another. Each line 131b may extend from the top to the bottom as exemplarily shown in FIG. 2, or may extend from the top to a middle point or from the bottom to the middle point such that upper half lines and lower half lines are alternately arranged rather than being connected to each other as exemplarily shown in FIG. 3. Alternatively, as exemplarily shown in FIG. 4, instead of the holes 131a, the opening may include elongated slots.

If the thin front plate 131 thermally expands in response to temperature increase, the size of the opening may be reduced to cancel a variation in length due to thermal expansion. As such, it is possible to reduce length variation of the multi-layer panel 130 that exhibits greater length variation than the display panel 110. Similar to the thin front plate 131, the thin rear plate 132 may include an opening consisting of vertically aligned holes 132a to define a plurality of lines 132b horizontally spaced apart from one another.

Figure 5:
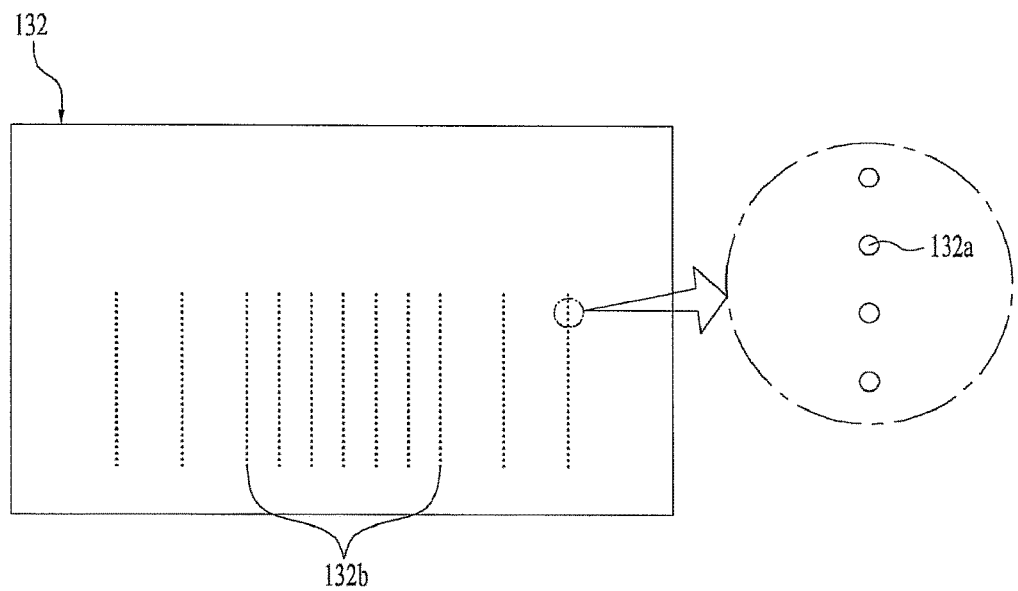
FIG. 5 is a rear view showing a thin front plate of the display device according to one embodiment of the present disclosure.

Although the respective lines 131b may be arranged equidistant from each other in the same manner as the above-described thin front plate 131, as exemplarily shown in FIG. 5, the lines may be more densely arranged in a center region that is most susceptible to the bending deformation. Alternatively, the interval between the lines 132b of the thin rear plate 132 may be more reduced at a portion where elements that emit a large amount of heat are located.

The thin front plate 131 may be covered by the thin rear plate 132 and the display panel 110, and therefore may have less restriction as to a position of the opening. However, as exemplarily shown in FIG. 1, if the metal plate 140 and the rear cover 150 are sized to cover only a part of the multi-layer panel 130, a part of the thin rear plate 132 may be exposed reward of the display device 100. In this case, the opening may be formed only in a region covered by the metal plate 140 and the rear cover 150.

Figure 6:
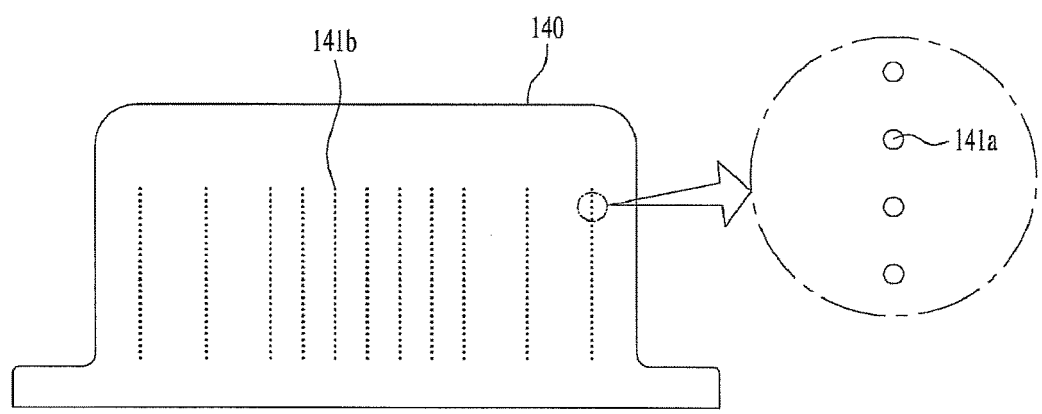
FIGS. 6 and 7 are rear views of a metal plate of the display device according to the present disclosure.
Figure 7:
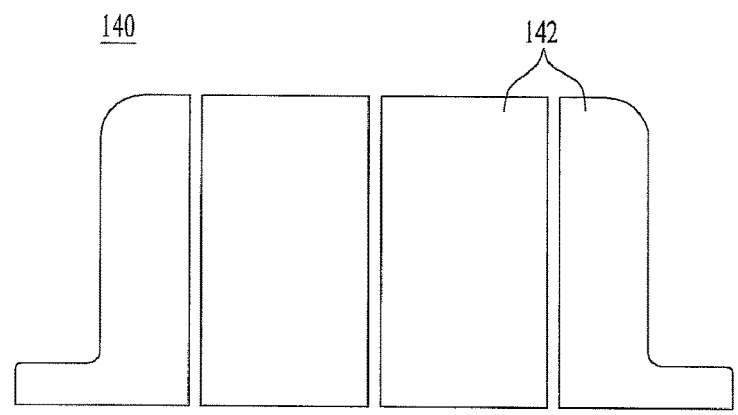

FIGS. 6 and 7 are rear views showing the metal plate 140 of the display device 100 according to the present disclosure. Similar to the thin rear plate 132 and the thin front plate 131, the metal plate 140 may include a plurality of vertically aligned holes 141a, and a plurality of lines 141b, each of which includes the plurality of holes 141a, may be horizontally spaced apart from one another. The lines 141b may be arranged at a constant interval, or may be densely arranged at a region where the greatest amount of heat is generated, or may be more densely arranged at a center region where the greatest amount of bending deformation occurs. That is, the density of the lines 141b near the central region of the display may be greater than a density of the lines 141b near lateral regions of the display.

Alternatively, as exemplarily shown in FIG. 7, a plurality of segment plates 142 may be arranged in a longer side direction. The segment plates 142 may be spaced apart from one another, and therefore gaps between the segment plates 142 compensate for increase in the length of each segment plate 142, which may substantially prevent deformation of the metal plate 140 from having an effect on bending deformation of the entire display device 100.

Providing the multi-layer panel 130 and the metal plate 140, which are formed of metal materials and have greater rates of thermal deformation than the display panel 110, with the opening or the plurality of segment plates 142 may compensate for length variation due to thermal expansion.

The adhesive layer 115, which is interposed between the display panel 110 and the multi-layer panel 130 to couple the display panel 110 and the multi-layer panel 130, may also undergo thermal expansion. However, unlike the display panel 110 or the multi-layer panel 130, the adhesive layer 115 is soft and is not bent even when it is deformed.

That is, in the case in which the multi-layer panel 130 is greatly tensioned and the display panel 110 is less tensioned, length variation of the multi-layer panel 130 has a direct effect on the display panel 110 if the adhesive layer 115 firmly couples the two members to each other. However, if the adhesive layer 115 is gently deformed, the adhesive layer 115 may cancel out the length variation caused upon tensioning of the multi-layer panel 130. As such, the display panel 110 may be less affected by thermal expansion of the multi-layer panel 130.

That is, the adhesive layer 115 may serve not only to attach the display panel 110 and the multi-layer panel 130 to each other, but also to cancel deformation of the multi-layer panel 130 during thermal expansion, thereby preventing bending of the display panel 110. Since the aforementioned two properties contradict each other, when considering only adhesive force, the adhesive layer 115 may be formed of a hard and highly adhesive material.

However, the adhesive layer 115 may be provided to have a high elongation percentage in order to compensate for thermal expansion of the multi-layer panel 130 as described above. To sufficiently cancel out deformation of the multi-layer panel 130, the adhesive layer 115 may have an elongation percentage of about 800% or more.

FIG. 8 is a rear view of the adhesive layer 115 of the display device 100 according to the present disclosure. The adhesive layer 115 may be configured to cover the entire display panel 110 as exemplarily shown in FIG. 8A. In this case, the adhesive layer 115 exhibits increased adhesive force, which may cause the display panel 110 to be bent according to deformation of the multi-layer panel 130. On the other hand, if the adhesive layer 115 is configured to cover only a part of the display panel 110 as exemplarily shown in FIGS. 8B, 8C and 8D, the adhesive layer 115 may be easily extended. The adhesive layer 115 may be required to cover an area corresponding to 60% or more of the display panel 110 or the multi-layer panel 130 because the area of the adhesive layer 115 is associated with coupling force between the display panel 110 and the multi-layer panel 130. The adhesive layer 115 may also be required to cover an area corresponding to 70% or more of the display panel 110 or the multi-layer panel 130.

Figure 8A:
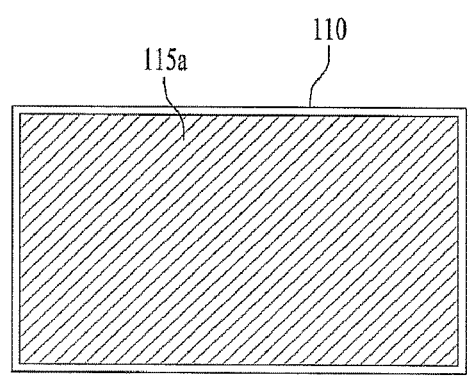
FIGS. 8A to 8D are rear views of an adhesive layer of the display device according to the present disclosure.
Figure 8B:
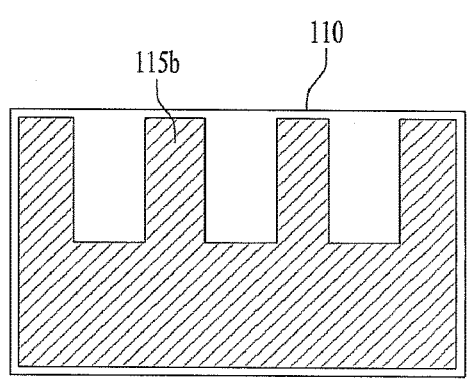
Figure 8C:
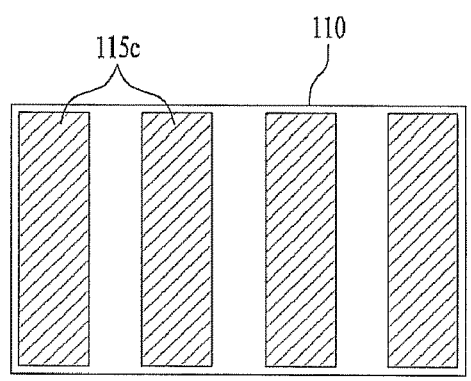
Figure 8D:
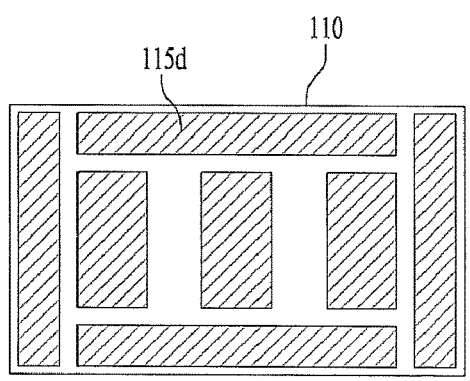

FIGS. 8B, 8C and 8D show the adhesive layer 115 configured to cover a two-third area that of FIG. 8A. More specifically, a partial upper portion of the adhesive layer 115 may be omitted as exemplarily shown in FIG. 8B, or the adhesive layer 115 may be divided into a plurality of separate sections extending in a direction parallel to a shorter side as exemplarily shown in FIG. 8C. Alternatively, the adhesive layer 115 may be vertically and horizontally split into a plurality of separate sections as exemplarily shown in FIG. 8D.

Figure 9:
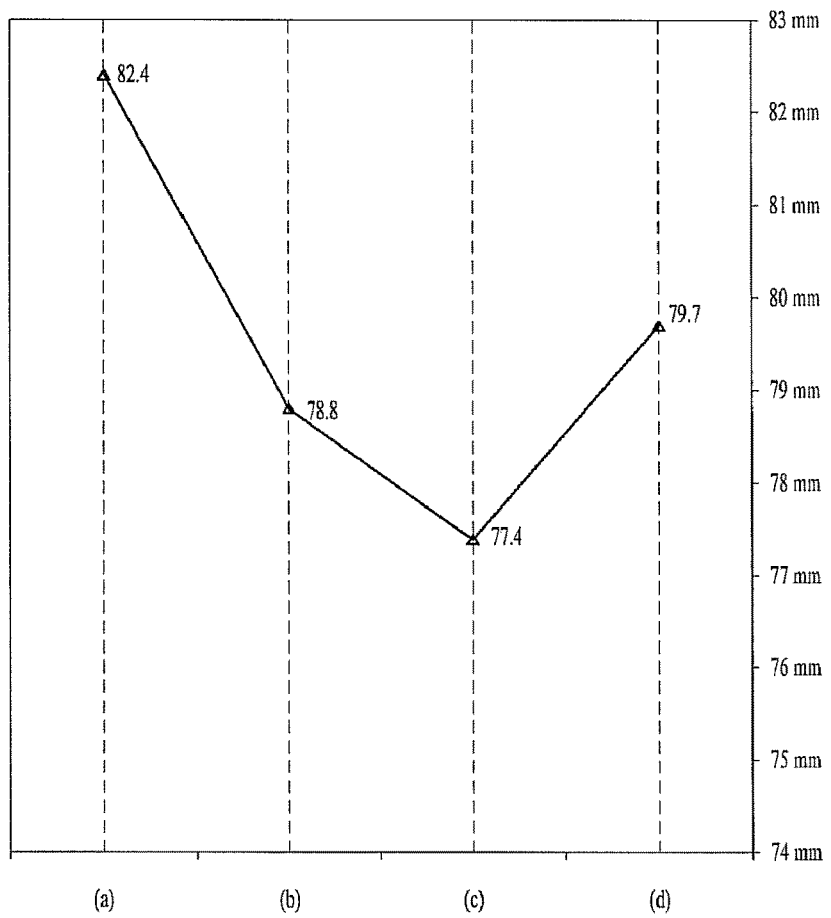
FIG. 9 is a graph showing adhesion performance and bending deformation according to the embodiment of FIG. 8.

FIG. 9 is a graph showing bending deformation depending on arrangement of the adhesive layer 115 of FIGS. 8A to 8D. In the graph, the line shows variation of a bending deformation degree and the least amount of deformation occurs in the case of FIG. 8C. In consideration of the fact that an amount of horizontal deformation is great, the case of FIG. 8C adopting horizontally split sections suitable to sufficiently cancel the horizontal deformation may be the most effective to prevent transfer of thermal expansion of the multi-layer panel 130 to the display panel 110.

Figure 10:
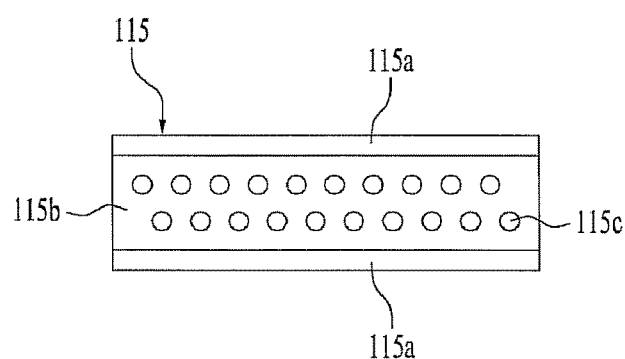
FIG. 10 is a sectional view of an adhesive layer of the display device according to the present disclosure.

The adhesive layer 115 may include a double-sided tape. FIG. 10 is a sectional view showing the double-sided tape 115 as one embodiment of the adhesive layer 115 of the display device 100 according to the present disclosure. The double-sided tape 115 may be formed by applying adhesive 115a to both surfaces of a resin layer 115b. If the resin layer 115b has a high elongation percentage, the double-sided tape 115 may have a high elongation percentage.

As exemplarily shown in FIG. 10, when using the double-sided tape 115 including the porous resin layer 115b having pores 115c, the double-sided tape 115 is more easily extended. The double-sided tape 115 including the porous resin layer 115b has four times greater elongation percentage than a double-sided tape formed of Carbon Fiber Reinforced Plastics (CFRP).

Figure 11:
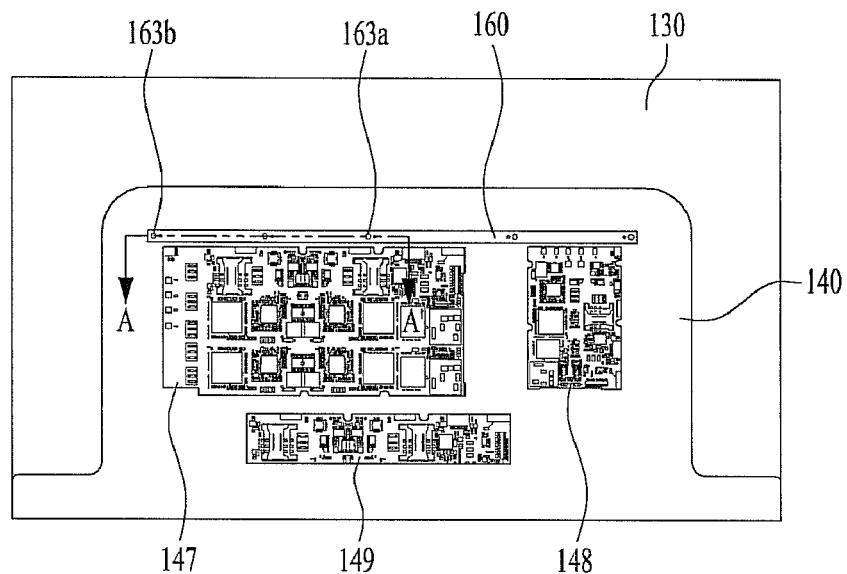
FIG. 11 is a rear view showing a separated state of the rear cover of the display device according to the present disclosure.
Figure 12:
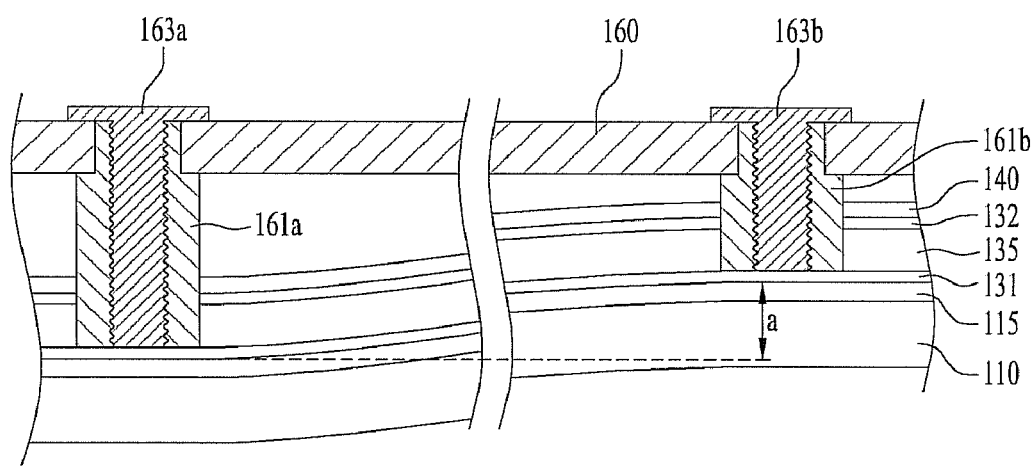
FIG. 12 is a sectional view taken along the line A-A' of FIG. 11.

FIG. 11 is a rear view showing a separated state of the rear cover 150 of the display device 100 according to the present disclosure, and FIG. 12 is a sectional view taken along the line A-A' of FIG. 11. A rigid bar 160 may be further provided at the rear surface of the multi-layer panel 130 so as to extend in a horizontal direction. The rigid bar 160 may prevent the front surface of the display panel 110 from being concavely bent.

The rigid bar 160 is a bar-shaped member and is formed of a material that is not easily bent. The rigid bar 160 may be fixed to PEM nuts 161 (or self-clinching nut), which may be inserted into the multi-layer panel 130 to protrude from a rear surface of the metal plate 140, via screws 163.

Although simply coupling the linear rigid bar 160 may prevent bending deformation of the display panel 110 in which both ends of the display panel 110 protrude forward and a center region of the display panel 100 protrudes rearward, it is possible to cancel deformation due to temperature increase when previously applying deformation force in an opposite direction.

FIG. 12 is a sectional view showing a state in which the display panel 110 and the multi-layer panel 130 are coupled to the rigid bar 160 so as to centrally protrude forward at a center region thereof and protrude rearward at left and right ends thereof.

In the present embodiment, a PEM nut 161a located at the center region of the display and a PEM nut 161b located at a side region may have different lengths. As exemplarily shown in FIG. 12, the rigid bar 160 having a slightly bulged front surface may be fixed to the display panel 110 and the multi-layer panel 130.

If the PEM nut 161a located at the center region of the multi-layer panel 130 is long and the PEM nut 161b located at either end of the multi-layer panel 130 is short, the rigid bar 160 or the multi-layer panel 130 may be kept in a bent state. Since the rigid bar 160 is harder than the multi-layer panel 130, the multi-layer panel 130 is originally kept in a bent state. Therefore, before the display device 100 is driven, as exemplarily shown in FIG. 12, the multi-layer panel 130 slightly protrudes forward by a height difference a between the PEM nuts 161a and 161b.

Once the display device 100 begins driving, the front surface of the multi-layer panel 130 begins to be concavely deformed due to thermal expansion of the multi-layer panel 130 as the temperature of the display device 100 increase. In the present embodiment, such concave deformation of the front surface of the multi-layer panel 130 occurs in a state in which force has previously been applied in a direction opposite to the above deformation caused by thermal expansion such that the center region of the front surface of the multi-layer panel 130 slightly protrudes forward owing to provision of the rigid bar 160 and the PEM nuts 161a and 161b having a height difference. Therefore, after the multi-layer panel 130 has completely been deformed due to thermal expansion, the multi-layer panel 130 exhibits less deformation than the case in which the rigid bar 160 is not used.

TABLE 1

| Height Difference of PEM Nuts | 282 W | 271 W | 255 W | 234 W |
| --- | --- | --- | --- | --- |
| 0 mm | 2.5 mm | 2.5 mm | 2.5 mm | 3 mm |
| 1.0 mm | 2.5 mm | 2.5 mm | 2.5 mm | 2.5 mm |
| 2.0 mm | 2.0 mm | 2 mm | 1.5 mm | 1.5 mm |

The above Table 1 shows a deformation degree of the panel depending on power consumption of the display device 100. A temperature difference of about 1° C. occurs per 10 W. Assuming that a height difference between the PEM nut 161b located at the end and the PEM nut 161a located at the center region is 2 mm, the front surface of the display device 100 is concavely deformed even when power consumption is 282 W, and thus deviation between the end and the center region is only 2 mm.

As is apparent from the above description, according to at least one embodiment of the present disclosure, the opening formed in the multi-layer panel 130 may be reduced in size to compensate for deformation of the multi-layer panel 130 due to thermal expansion, which may minimize increase in the length of the entire multi-layer panel 130.

Further, as the adhesive layer 115 is extended to correspond to the thermally deformed multi-layer panel 130, it may be possible to substantially prevent thermal expansion of the multi-layer panel 130 from having a negative effect on the display panel 110, which may minimize concave deformation of the front surface of the display device 100.

Furthermore, owing to providing the rigid bar 160 that preloads a prescribed amount of force required to keep the center region of the multi-layer panel 130 in a slightly forwardly bulged state, it is possible to reduce the amount of deformation of the forwardly concave front surface even if the multi-layer panel 130 thermal expands.

As broadly described herein, the present disclosure is directed to a display device that substantially obviates one or more problems due to limitations and disadvantages of the related art. One object of the present disclosure is to provide a display device having a sandwich honeycomb panel to minimize bending deformation due to thermal expansion.

To achieve these objects and other advantages and in accordance with the purpose of the disclosure, as embodied and broadly described herein, a display device may include a display panel, a sandwich honeycomb panel including a thin front plate located toward the display panel, a thin rear plate disposed on a rear surface of the thin front plate, and a honeycomb mesh interposed between the thin front plate and the thin rear plate, the honeycomb mesh having a plurality of hexagonal unit cells, and a metal plate coupled to a rear surface of the sandwich honeycomb panel such that a drive board is seated on the metal plate, wherein at least one of the thin front plate or the thin rear plate includes at least one opening formed parallel to a shorter side of the display device.

The opening may include a plurality of holes arranged parallel to the shorter side.

The opening may be a slit extending in a direction parallel to the shorter side.

The at least one opening may include a plurality of openings spaced apart from one another in a direction parallel to a longer side of the display device.

Distances between the openings may be reduced at a center region of the display device and may be increased at both ends of the display device.

The display device may further include a rear cover coupled to the rear surface of the sandwich honeycomb panel, and the opening of the thin rear plate may be formed only in a portion of the thin rear plate covered by the rear cover.

The metal plate may include an opening formed parallel to the shorter side of the display device.

The metal plate may further include a plurality of segment plates arranged in a direction parallel to a longer side of the display device, and the segment plates may be spaced apart from one another.

The display device may further include an adhesive layer interposed between the display panel and the sandwich honeycomb panel, and the adhesive layer may be divided into a plurality of sections so as to be separately arranged in a plurality of regions of a rear surface of the display panel.

The sections of the adhesive layer may be spaced apart from one another in a direction parallel to a longer side of the display device.

An area of the adhesive layer may be less than 60% or 70% of an area of the display panel.

The adhesive layer may be a double-sided tape formed by applying adhesive to both surfaces of a porous resin layer.

The adhesive layer may have an elongation percentage of about 800% or more.

The display device may further include a plurality of PEM nuts arranged on a rear surface of the metal plate in a direction parallel to a longer side of the display device, and a rigid bar coupled to the rear surface of the metal plate via screws inserted into the PEM nuts.

A height of the PEM nuts located at both ends of the display device may be less than a height of the PEM nut located at another position.

In one embodiment, a display device may include a display panel, a multi-layered panel provided adjacent the display panel and including a front plate located toward the display panel, a rear plate provided parallel to the front plate, and a honeycomb pattern mesh interposed between the front plate and the rear plate, the honeycomb pattern mesh having a plurality of hexagonal cells to form a honeycomb pattern, and a metal plate coupled to a rear surface of the multi-layered panel and a drive board provided on the metal plate. At least one of the front plate or the rear plate may include at least one opening that extends parallel to a shorter side of the display device.

The opening may include a plurality of holes which are arranged in a line that extends parallel to the shorter side. The opening may be a slit formed through the front plate or the rear plate that extends parallel to the shorter side. A plurality of the openings may be provided to be spaced apart from one another in a direction parallel to a longer side of the display device. Moreover, the openings in a central region of the display device may be arranged a first distance from each other and the openings at lateral regions of the display device may be arranged a second distance from each other, the second distance being greater than the first distance.

A rear cover may be provided coupled to the rear surface of the multi-layered panel, wherein the at least one opening provided on the rear plate is formed only in a region of the rear plate covered by the rear cover. The metal plate may include at least one opening formed parallel to the shorter side of the display device. The metal plate may include a plurality of segment plates arranged in a direction parallel to a longer side of the display device, and wherein the segment plates are spaced apart a prescribed distance from one another.

An adhesive layer may be interposed between the display panel and the multi-layered panel, wherein the adhesive layer is divided into a plurality of sections which are each arranged separately in a plurality of regions of a rear surface of the display panel. The sections of the adhesive layer may be spaced apart from one another in a direction parallel to a longer side of the display device. An area of the adhesive layer may be less than 60% or 70% of an area of the display panel. The adhesive layer may be a double-sided tape that includes a porous resin layer and an adhesive provided on both surfaces of the porous resin layer. Moreover, the adhesive layer may be an elongation percentage of about 800% or more.

A plurality of PEM nuts may be arranged on a rear surface of the metal plate, and a bar may be provided on the rear surface of the metal plate parallel to a longer side of the display device and positioned to correspond to the PEM nuts, the bar being coupled to the rear surface of the metal plate by screws inserted into the PEM nuts. A height of the PEM nuts located in lateral regions of the display device may be less than a height of the PEM nut located in other regions.

In one embodiment, a display device may include a display panel, an adhesive layer having a prescribed pattern provided on a rear surface of the display panel, a multi-layered panel coupled to the display panel by the adhesive layer, the multi-layered panel including a mesh panel layer having a honeycomb pattern, a metal plate provided adjacent the multi-layered panel, a bar provided on the metal plate, and a rear cover provided to cover the metal plate. The display panel may have a first rate of thermal expansion, the multi-layered panel may have a second rate of thermal expansion, and the metal plate may have a third rate of thermal expansion. Moreover, the multi-layered panel and the metal plate may thermally expand at a greater rate than the display panel with respect to temperature.

The multi-layered panel may include a first metal panel layer, a second metal panel layer, and the mesh panel layer may be provided between the first and second metal panel layers, the mesh panel layer having a plurality of hexagonal regions provided adjacent to each other to form the honeycomb pattern. At least one of the multi-layered panel or the metal plate may include a plurality of holes, the plurality of holes aligned to form a plurality of vertical lines which are provided a prescribed distance from an adjacent vertical line of holes. A density of the plurality of vertical lines may be greater in a central region of the display panel than a lateral region of the display panel. Moreover, the bar may be provided horizontally across the metal plate and configured to bend the display panel to have a prescribed amount of convex curvature, the prescribed amount of convex curvature corresponding to an amount of deformation of the display panel caused by thermal expansion.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel;
at least one supporting plate provided adjacent the display panel;
a metal plate coupled to a rear surface of the at least one supporting plate and a drive board provided on the metal plate;
a plurality of openings formed at least one of the supporting plates or the metal plate, the opening extending parallel to a first direction along a shorter side of the display device; and
a rear cover placed at a rear side of the supporting plate and the metal plate and covering the plurality of openings,
wherein the plurality of the openings are spaced apart from each other in a second direction parallel to a longer side of the display device, and
wherein a spacing between openings at a central region of the display device is a first distance, and a spacing between openings in the second direction at lateral regions of the display device is a second distance, the second distance being greater than the first distance.

2. The display device according to claim 1, wherein the plurality of openings include a plurality of holes which are arranged in a line that extends parallel to the shorter side.

3. The display device according to claim 1, wherein each opening is a slit formed through the supporting plate that extends parallel to the shorter side.

4. The display device according to claim 1, wherein a plurality of the supporting plates are arranged to form a multi-layered structure.

5. The display device according to claim 1, wherein the metal plate includes a plurality of segment plates arranged in a direction parallel to a longer side of the display device, and
wherein the segment plates are spaced apart a prescribed distance from one another.

6. The display device according to claim 5, wherein the adhesive layer is a double-sided tape that includes a porous resin layer and an adhesive provided on both surfaces of the porous resin layer.

7. The display device according to claim 5, wherein the adhesive layer has an elongation percentage of about 800% or more.

8. The display device according to claim 1, further including an adhesive layer interposed between the display panel and the supporting plate,
wherein the adhesive layer is divided into a plurality of sections which are each arranged separately in a plurality of regions of a rear surface of the display panel.

9. The display device according to claim 8, wherein the sections of the adhesive layer are spaced apart from one another in a direction parallel to a longer side of the display device.

10. The display device according to claim 1, further including
a plurality of PEM nuts arranged on a rear surface of the metal plate, and
a bar provided on the rear surface of the metal plate parallel to a longer side of the display device and positioned to correspond to the PEM nuts, the bar being coupled to the rear surface of the metal plate by screws inserted into the PEM nuts.

11. The display device according to claim 10, wherein a height of the PEM nuts located in lateral regions of the display device is less than a height of the PEM nut located in other regions.

12. A display device comprising:
a display panel;
an adhesive layer having a prescribed pattern provided on a rear surface of the display panel;
at least one supporting plate coupled to the display panel by the adhesive layer;
a metal plate provided adjacent the supporting plate;
a plurality of openings formed at least one of the supporting plate or the metal plate, the opening extending parallel to a first direction along a shorter side of the display device;
a bar provided on the metal plate; and
a rear cover provided to cover the plurality of openings,
wherein the display panel has a first rate of thermal expansion, the supporting plate has a second rate of thermal expansion, and the metal plate has a third rate of thermal expansion, and
wherein the supporting plate and the metal plate thermally expand at a greater rate than the display panel with respect to temperature,
wherein the bar is provided horizontally across the metal plate and configured to bend the display panel to have a prescribed amount of convex curvature, the prescribed amount of convex curvature corresponding to an amount of deformation of the display panel caused by thermal expansion.

13. The display device according to claim 12, wherein the supporting plate includes a first metal panel layer, a second metal panel layer, and a mesh panel layer provided between the first and second metal panel layers, the mesh panel layer having a plurality of hexagonal regions provided adjacent to each other to form a honeycomb pattern.

14. The display device according to claim 12, wherein at least one of the supporting plate or the metal plate includes a plurality of holes, the plurality of holes aligned to form a plurality of vertical lines which are provided a prescribed distance from an adjacent vertical line of holes.

15. The display device according to claim 14, wherein a density of the plurality of vertical lines are greater in a central region of the display panel than a lateral region of the display panel.

16. The display device according to claim 12, further including a plurality of PEM nuts coupling the bar and the rear surface of the metal plate,
wherein a height of the PEM nuts located in lateral regions of the display device is less than a height of the PEM nut located in other regions.

* * * * *